United States Patent [19]

Dischert et al.

[11] Patent Number: 5,659,313
[45] Date of Patent: Aug. 19, 1997

[54] SYSTEM AND METHOD FOR REDUCING NOISE DURING ANALOG TO DIGITAL CONVERSION

[75] Inventors: Lee Robert Dischert, Medford, N.J.; Robert Joseph Topper, Hatboro, Pa.

[73] Assignee: Panasonic Technologies, Inc., Princeton, N.J.

[21] Appl. No.: 414,352

[22] Filed: Mar. 31, 1995

[51] Int. Cl.⁶ .................................................. H03M 1/00
[52] U.S. Cl. .......................... 341/132; 341/131; 341/155
[58] Field of Search ...................... 341/155, 132, 341/138, 140, 139

[56] References Cited

U.S. PATENT DOCUMENTS

| | | | |
|---|---|---|---|
| 4,160,244 | 7/1979 | Solomon et al. | 341/148 |
| 4,216,465 | 8/1980 | Huelsman et al. | 341/138 |
| 4,674,062 | 6/1987 | Premerlani | 364/602 |
| 4,712,132 | 12/1987 | Soca | 348/678 |
| 4,851,842 | 7/1989 | Iwamatsu | 341/139 |
| 4,928,102 | 5/1990 | Katzenstein | 341/159 |
| 4,983,973 | 1/1991 | Lewyn | 341/138 |
| 4,990,913 | 2/1991 | Beauducel | 341/139 |
| 4,990,917 | 2/1991 | Kohdaka | 341/159 |
| 5,053,771 | 10/1991 | McDermott | 341/156 |
| 5,059,980 | 10/1991 | Katzenstein | 341/159 |
| 5,066,952 | 11/1991 | Koerner | 341/138 |
| 5,225,837 | 7/1993 | Hosotani et al. | 341/159 |
| 5,231,398 | 7/1993 | Topper | 341/156 |
| 5,250,948 | 10/1993 | Berstein et al. | 341/131 |

FOREIGN PATENT DOCUMENTS 0 563 877 A2  6/1993  European Pat. Off. .

OTHER PUBLICATIONS

Principles of Color Reproduction, no date.

*Primary Examiner*—Todd DeBoer
*Attorney, Agent, or Firm*—Ratner & Prestia

[57] ABSTRACT

A system and method for reducing signal-to-noise ratio in a multi-component analog signal during analog to digital conversion. The multi-component analog signal is made up of a plurality of separate analog signals, with each of the separate analog signals having separate amplitude levels. A reference gain control signal, corresponding to the largest amplitude component of the multi-component signal, is first determined. Next, the reference gain control signal is used to generate a gain control signal. The gain control signal is then used to adjust each component of the multi-component signal by a gain value. Finally, the gain adjusted signals are converted to corresponding digital signals.

28 Claims, 7 Drawing Sheets

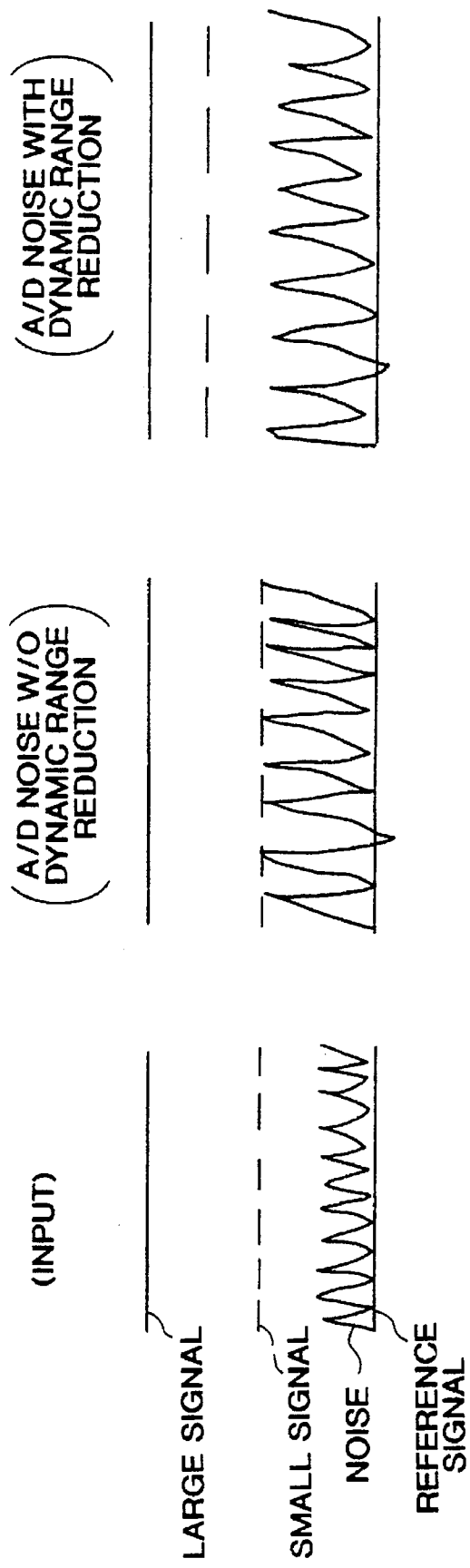

SYSTEM AND METHOD FOR REDUCING NOISE DURING ANALOG TO DIGITAL CONVERSION

FIELD OF THE INVENTION

The present invention relates to system and methods for reducing the addition of noise during analog-to-digital (A/D) conversion. More specifically the present invention relates to the reduction of noise added to multi-component signals such as R,G,B video signals and stereo audio signals by devices such as analog-to-digital converters (ADCs) or digital processing systems, without affecting the relationship among the components of the multi-component signal.

BACKGROUND OF THE INVENTION

Many systems using video image signals or television/NTSC image signals (hereinafter collectively referred to as "video" signals) involve the conversion of analog signals to digital signals for recording, processing, transmitting and/or storing the images. Similar processes, also requiring analog to digital conversion, may also take place with respect to audio signals. Although digital processing can be used to remove or correct for certain noise levels once analog to digital conversion has taken place (regardless of whether video or audio signals are involved), additional circuitry and processing power is required which results in higher costs and increased complexity of circuit design and programming. The costs and complexity continue to rise as the signal-to-noise ratio of analog signals increase.

Improvements in image pick-up devices, such as charge coupled devices (CCDs), have made conversion of analog signals to digital signals more difficult and more expensive. One factor is that as the signal-to-noise ratio (SNR) approaches and exceeds seventy (70) db, ADCs with adequate quantization accuracy (particularly in the small signal, critical region) become more difficult to build.

The effect of noise on small amplitude analog signals is greater than the effect of noise on large amplitude analog signals. This is particularly evident as the amplitude of the small signal and the amplitude of the noise signal are closer in magnitude to each other. Compounding the noise problem for small signals, ADCs tend to add "channel noise", as do other digital processing components and systems. The addition of channel noise can be significant in reducing the small signal, signal-to-noise ratio. As the small signal, signal-to-noise ratio approaches 1:1, the small signal becomes effectively lost in the noise signal. Removing or reducing noise at that point is difficult. Even then, it is possible to lose part(s) of the small signal in trying to remove or reduce the noise component.

It is understood that noise is more visible and has a greater detrimental effect (in terms of perception) on small (low amplitude level) video or audio signals than on large (high amplitude level) signals. Thus, adding a noise signal with higher amplitude to a large signal may achieve the same level of perceived signal degradation by a viewer or listener as compared to adding a noise signal with a smaller amplitude to a small signal.

In order to reduce perceivable quantization noise, it is desirable for analog video signals to be encoded with more bits in the low level regions when quantizing an analog signal during A/D conversion. Small signals are viewed as the "critical region" since noise is more noticeable for the smaller signals than the larger signals. In video applications, small signals provide black or dark color while large signals provide white or saturated color.

Merely increasing the gain of analog input signals across the entire dynamic range of the input signal does not solve the problem of additional noise from ADCs. If the gain increase required to effectively minimize the noise added by the A/D conversion is large enough, the corresponding gain increase to the large signal may yield too great a large signal amplitude. At this point clipping and loss of signal information may occur.

When carrying out noise reduction on multi-component signals such as R,G,B video signals (a three component signal comprised of red, green and blue signals) or stereo audio signals (a two component signal comprised of right channel and left channel signals) it is important to maintain the relationship of each component of the multi-component signal to the other component(s) of the multi-component signal. If noise reduction (gain change) is not carried out in the same amount on each component of the multi-component signal, the final signal may be adversely affected from the perspective of the viewer/listener. For example, if the red, blue or green components of an R,G,B video signal are individually modified, the colorimetry or chromaticity may be adversely affected. In the case of a stereo audio signal, the signal balance between right and left channels may be adversely affected.

SUMMARY OF THE INVENTION

The present invention involves a system and method for reducing noise added to a multi-component analog signal during analog-to-digital conversion. The multi-component analog signal is made up of a plurality of separate analog signals, with each of the separate analog signals having separate amplitude levels. Examples of multi-component analog signals include R,G,B video signals and right/left channel stereo audio signals.

A reference gain control signal, corresponding to the largest amplitude component of the multi-component signal, is first determined. Next, the reference gain control signal is used to generate a gain control signal. The gain control signal is then used to adjust each component of the multi-component signal by the same gain value. Following adjustment, the gain adjusted signal is converted from an analog signal to a digital signal.

BRIEF DESCRIPTION OF THE FIGURES

The present invention will be described by way of non-limiting examples, with reference to the attached drawings in which:

FIGS. 7A, 7B and 7C are graphs of amplitude vs. time of example waveforms which are useful for describing the operation of the present invention.

DETAILED DESCRIPTION

The present invention increases the gain of each component of a multi-component input signal prior to A/D conversion. The gain increase is non-linear in order to increase the gain for small signals (low amplitude levels) and relatively reduce the gain for large signals (high amplitude levels). In doing so, the clipping of large signals is reduced or minimized. At the same time, small signal gain is increased to reduce the effective noise added during A/D conversion. In this way, the small signal, signal-to-noise ratio is increased. The amount of gain applied to each component of the multi-component input signal is determined based on the amplitude levels of the largest components making up the multi-component signal.

Figure 1:
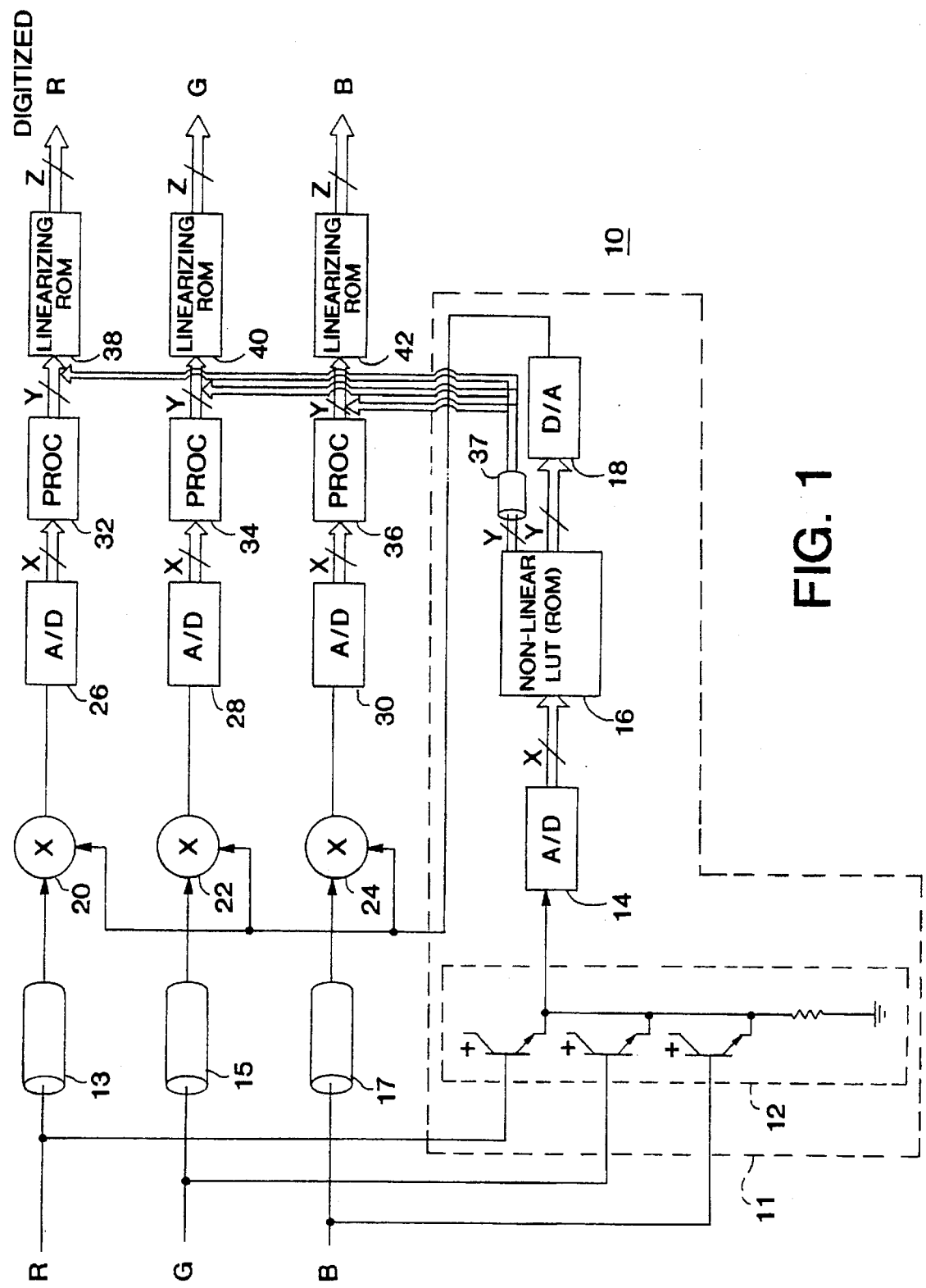
FIG. 1 is a schematic block diagram of a dynamic range reduction system in accordance with the present invention.

An exemplary embodiment of a System 10 in accordance with the present invention is shown in FIG. 1. System 10 has three component signals (R, G and B) of a multi-component R,G,B video signal entering a non-additive mixer (NAM) 12. NAM 12 is the first stage of a gain signal generation means 11. NAM 12 includes three transistors, such as the 2N3904, with the emitter of each transistor connected together, the collector of each transmitter connected to a positive voltage source. Each component of the multi-component signal is separately fed into the base connection of a respective transistor. NAM 12 determines the largest signal (i.e. highest amplitude level) of the three component signals and outputs this largest signal as an analog reference gain control signal to A/D converter 14. An example A/D converter 14 is the MC10319 by Motorola. For audio or bipolar signals, the NAM desirably determines the signal having the largest magnitude, whether it is positive or negative.

A/D converter 14 converts the largest signal to a digital signal which is then passed through a non-linear lookup table (LUT) 16 to generate a digital gain control signal. Non-linear LUT 16 is stored in read only memory (ROM). An example ROM suitable for use as non-linear LUT 16 is the 74LS471 (256×8) by National Semiconductor. The digital gain control signal generated through the use of non-linear LUT 16 is then converted to an analog gain control signal by D/A converter 18. An example of D/A converter 18 is the MC10318 by Motorola. Non-linear LUT 16 transforms the digital signal to a digital gain control signal.

The separate R, G and B signals are delayed by delay lines 13, 15 and 17, respectively. The duration of the delay corresponds to the amount of time spent generating the gain signal in gain signal generation means 11. In an exemplary embodiment, this delay time is approximately 2 or 3 clock cycles of the digital circuit. The delay time, if any, may differ from one embodiment to another. The following are example clock cycles:

Audio≈50 μS

Video≈70 nS

HD Video≈13 nS.

The analog gain signal is then applied uniformly to multipliers 20, 22 and 24. An example of multiplier is the MC1495 by Motorola. Multipliers 20, 22 and 24 multiply the respective R,G,B component signals (after delay) by the gain signal determined in gain signal generation means 11. The non-linear multiplication by the gain signal decreases the dynamic range of the over-all, multi-component input signal by increasing the small signal amplitude level with proportionately less adjustment to the large signals. The gain adjusted analog signals are then passed through ADCs 26, 28 and 30, respectively.

The digital gain adjusted signals may then, optionally, undergo additional digital processing in digital processors 32, 34 and 36, respectively, before being optionally relinearized by passing through linearizing ROMs 38, 40 and 42, respectively. An example linearizing ROM is the AM27C52 by Advanced Micro Devices. Linearizing ROM's 38, 40 and 42 restore the relationship of large signal to small signal as was present prior to non-linear gain adjustment at multipliers 20, 22 and 24. Accordingly, linearizing ROMs 38, 40 and 42 are shown connected to non-linear LUT 16. A delay line 37 is used to delay the signal to adjust for the delay(s) from A/D conversion and/or other processing. This connection provides the necessary information to relinearize the signals, if relinearization is taking place. A very close relinearization can be done without this signal when the quantizing limits of the non-linear curve is known.

The digital output from linearizing ROM's 38, 40 and 42 can then be applied to further digital processing or other applications. The digital output will have undergone A/D conversion with a minimum amount of quantization noise distortion, particularly to the small signals. This process results in increased quantization resolution in the small signal (low amplitude) region and reduced quantization resolution or quantization in the large (high amplitude regions). For video signals, this means increased quantization for black or dark signals and decreased quantization for white or saturated signals.

Following A/D conversion, the data paths of system 10 are shown as having X, Y and Z bit widths. Depending upon the application, X, Y and Z may be identical bit widths or Z>X to take advantage of noise reduction. For example, all digital signal paths may be 8 bits wide. It is possible, however, that some data paths may be larger or smaller, depending upon the processing.

For example, small signals may require a 1024 step resolution per input volt (1/1024 volt per step). This resolution requires a 10 bit data path ($2^{10}$=1024). At the same time, large signals may only require a 256 step resolution per input volt (1/256 volt per step). thus, while dealing with the largest signal, X and Y may be 8 bit wide data paths, while Z is a 10 bit wide data path (Z>X) following relinearization by linearizing ROMs 38, 40 and 42.

Figure 2:
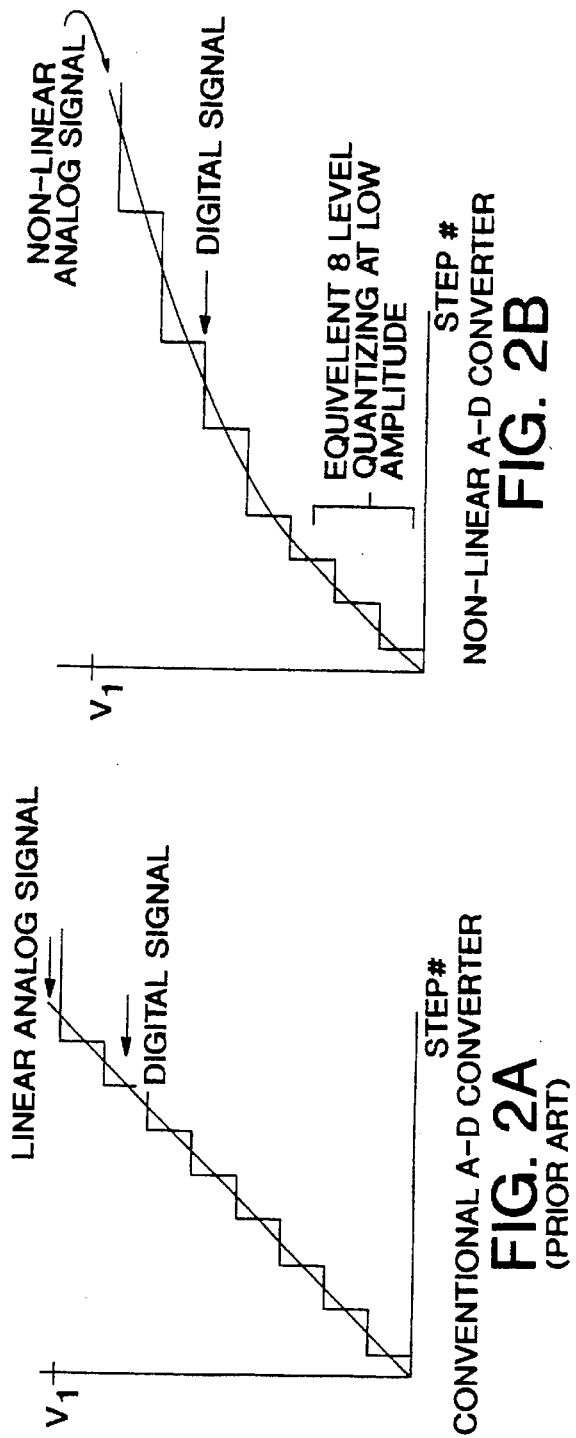
FIG. 2A is a graph of voltage vs. ADC step size of a conventional linear ADC.
FIG. 2B is a graph of voltage vs. ADC step size of a non-linear ADC.
FIG. 2C is a graph of voltage vs. ADC step size of the non-linear ADC shown in FIG. 2B after linearization.

There is shown in FIGS. 2A, 2B and 2C graphical examples of various A/D converted signals.

FIG. 2A shows a graph of an input voltage signal with the quantization of the analog voltage (digital signal). This quantization is uniform for all amplitude levels of the analog signal. The graph of FIG. 2A shows an example of 8 steps for a 1 volt (linear) analog signal.

FIG. 2B shows a graph of the effects of a non-linear A/D converter where the quantization of the (non-linear) analog signal varies with amplitude of the analog signal. As can be seen in FIG. 2B, the signal is quantized with increased resolution at lower amplitude levels and quantized with decreased resolution as amplitude levels increase.

FIG. 2C shows a graph of the non-linear quantization shown in FIG. 2B after relinearization. Thus, while the quantization resolution varies according to input amplitude signal level, the overall transfer function is linear. The application of non-linear quantization and relinearization in System 10 occurs equally for each component (R,G and B) of the multi-component signal. Thus, for the same 1 volt signal of FIG. 2A, only 5 steps are necessary. The same step resolution (number of steps), as shown in FIG. 2A, are used at low amplitude levels, while a different step resolution is used for higher amplitude signals. High resolution quantization occurs when all signals are low level. Low resolution quantization occurs when any one signal has a high level.

Figure 3:
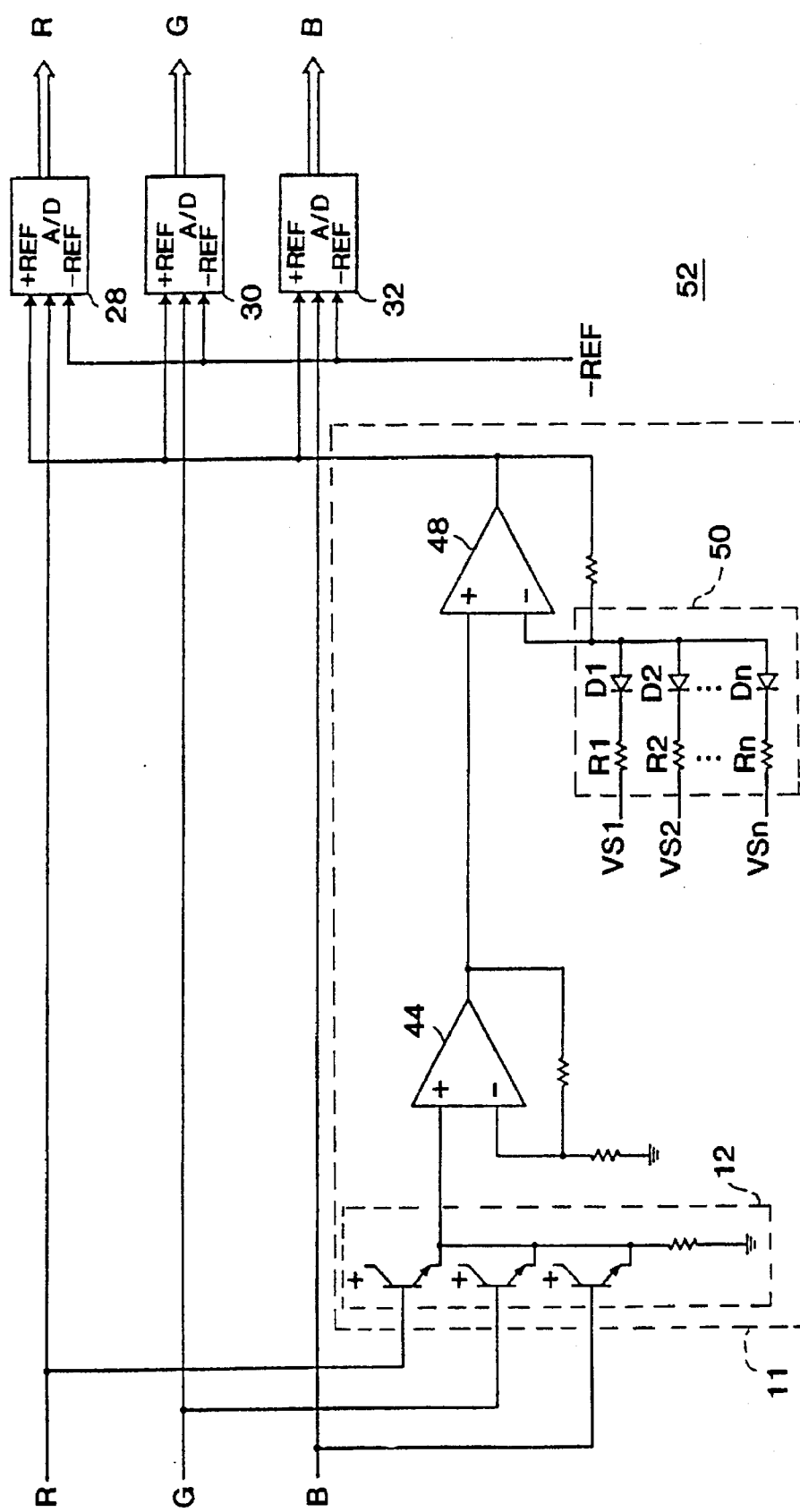
FIG. 3 is a schematic diagram, partly in block diagram form which shows an alternate embodiment of the present invention.

An additional embodiment System 52, of the present invention is shown in FIG. 3. System 52 uses analog components (as opposed to the LUTs of System 10) with an analog break point for determining gain adjustment of the analog signal.

If the amplitude of the largest signal output from NAM 12 is above a predetermined threshold level (knee level) the gain is set to a predetermined amount. An example of threshold level is 30% of the maximum input signal value. Large signals should not be gain adjusted so that they become to large for the A/D converters to handle. If the largest signal is below the predetermined threshold level, gain is increased a predetermined amount. If the largest signal is at the threshold level then the amplitude level of the input signal(s) should be maintained.

The individual R,G,B components enter NAM 12 which passes the largest signal to linear amplifier 44. Linear amplifier 44 amplifies the signal to the proper level for non-linear amplifier 48 to work over its designed range.

A diode network 50 is used to adjust the gain. As the input voltage to non-linear amplifier 48 is increased past the level of the voltage sources (VS1 to VSn), diodes (D1 to Dn) begin to conduct, decreasing the negative feedback. This in turn, increases the gain.

Increasing the gain of non-linear amplifier 48 increases the level of the output signal of the amplifier more for a given incremental input. As the output signal of non-linear amplifier 48 increases, the high reference potential applied to the ADCs 28, 30 and 32 increases. This increases the step size of the ADCs 28, 30 and 32. Increasing the step size of the ADCs increases quantizing noise. This only happens when an input is large. Conversely, when the inputs are small (low level) the gain of non-linear amplifier 48 is reduced, which decreases the step size of the ADCs and reduces quantizing noise below the level of linear analog to digital conversion.

The circuit 11 adjusts step reference voltage signal, thereby effectively adjusting the gain of the input signals to ADCs 28, 30 and 32. For example, increasing the positive reference signal at the ADCs reduces the gain of each component of the multi-component signal at ADCs 28, 30 and 32, respectively. An example A/D converter is the MC103101 by Motorola.

Figure 4:
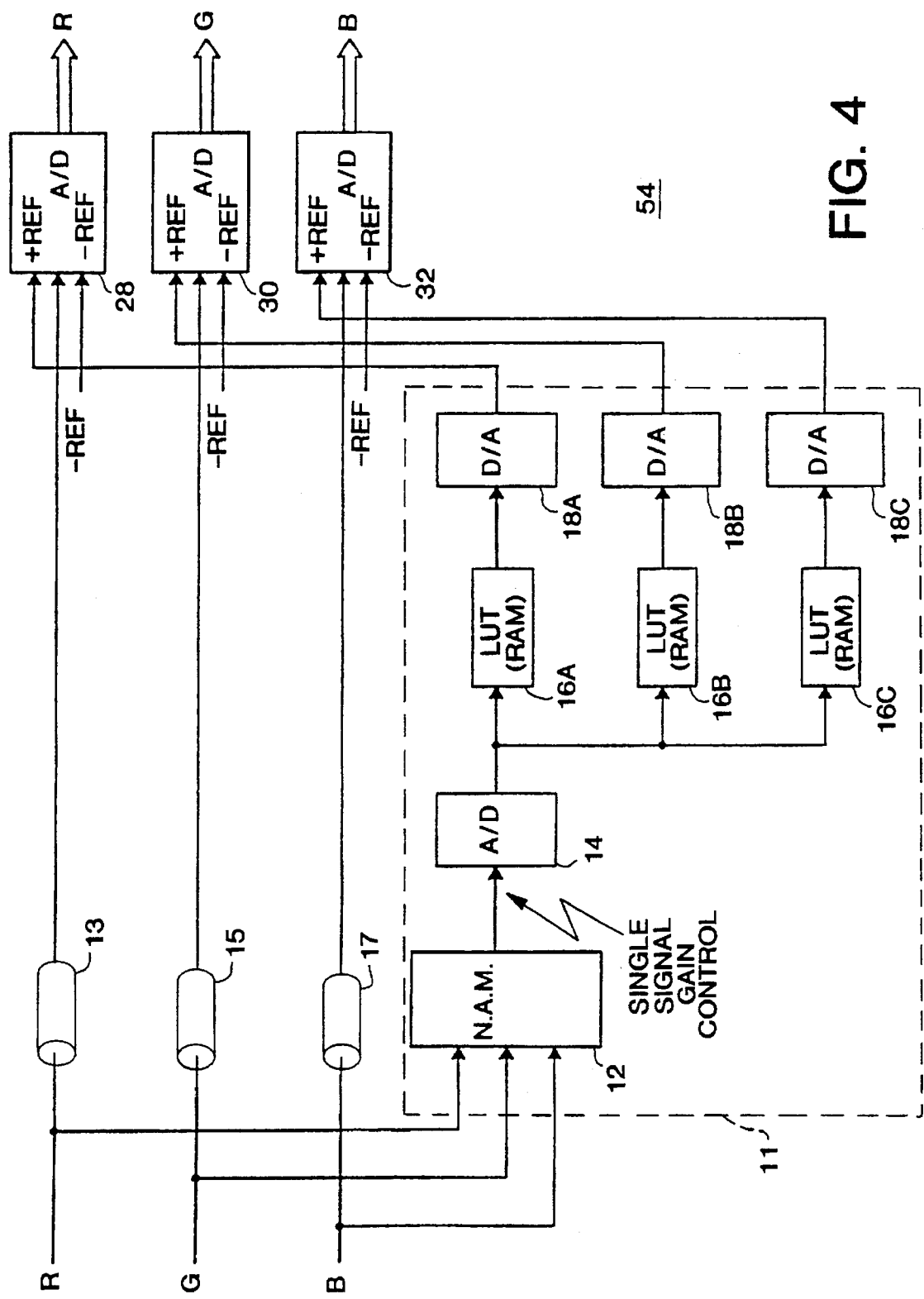
FIG. 4 is a block diagram which shows an additional alternate embodiment of the present invention.

FIG. 4 shows a System 54 which is an additional embodiment of the present invention. System 54 uses a digitally generated gain control signal. After the largest signal of the three components of the multi-component signal is output at NAM 12 and undergoes A/D conversion at ADC 14, the digital output signal of ADC 14 is fed into three separate non-linear lookup tables (LUTs) 16A, 16B and 16C. Non-linear lookup tables 16A, 16B and 16C are shown as residing in random access memory (RAM) in an exemplary embodiment. A micro-controller (not shown) is used to control the loading and calculations for the non-linear LUTS. The digital gain signal output from non-linear lookup tables 16A, 16B and 16C is input to D/A converters 18A, 18B and 18C, respectively. The analog output from D/A converters 18A, 18B and 18C is input as the positive reference (adjusted reference voltage signal) signal to A/D converters 28, 30 and 32.

The use of separate non-linear lookup tables allows for various corrections to the input signals without additional processing hardware. For example, inter-channel discrepancies of the multiplier|A/D converter circuitry may be accounted for by tailoring the gain functions loaded into the separate non-linear lookup tables 16A, 16B and 16C. Other gain related functions such as color balancing may be carried out with the non-linear look-up tables as well.

The use of multipliers as shown in System 10 of FIG. 1 or modification of reference voltages shown in System 54 of FIG. 4 are interchangeable, provided the non-linear look-up table function is modified accordingly. The A/D converters of System 10 have the positive and negative reference voltages fixed, not variable as in System 54 (and System 52). This will be understood by those skilled in the art.

System 54 also uses compensating delay lines 13, 15 and 17 to delay the transmission of the input signal during generation of a gain signal in gain signal generation means 11. As in System 10 shown in FIG. 1, the amount of delay provided by delay lines 13, 15 and 17 for System 54 is determined by the circuitry and/or processing of gain signal generation means 11.

Figure 5:
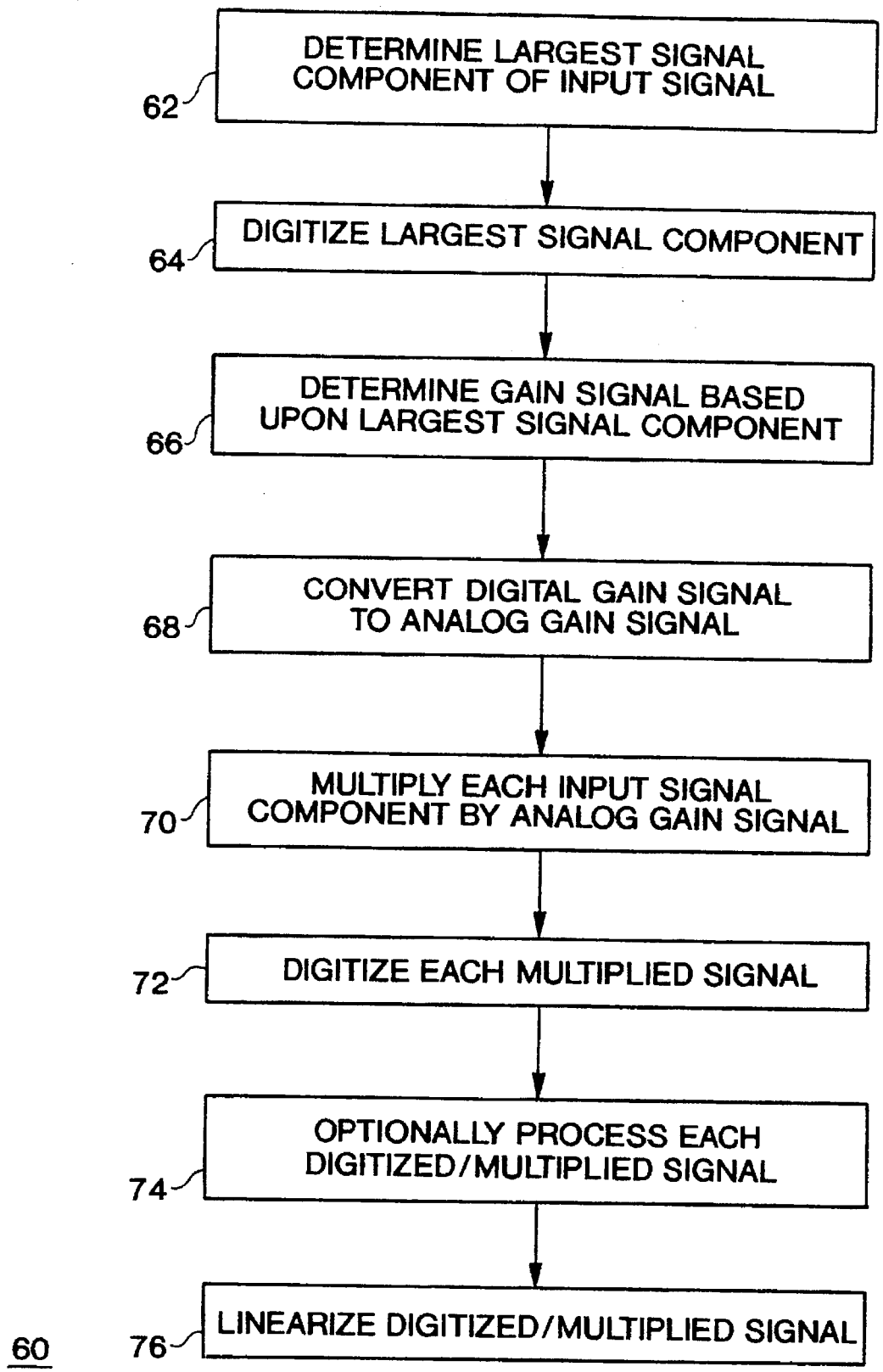
FIG. 5 is a flow chart of a method using exemplary system shown in FIG. 1.

There is shown in FIG. 5 a flow chart of a method using System 10 shown in FIG. 1. In Block 62 the largest signal component of the multi-component input signal is determined. The largest signal of each component signal is selected so that amplitude of the gain adjusted signal does not exceed the parameters of the A/D converters. If the amplitude of the gain adjusted signal is too high, clipping and thus signal loss may result. In order to maintain the ratios between the individual components of the multi-component signal, it is desirable for the largest signal component to dictate the gain value by which all signal components are adjusted.

In block 64 the largest signal component is digitized, converting the analog signal into a digital signal. The digital signal is then used to determine the gain signal which multiplies each component of the multi-component input signal, separately. In the embodiment shown in FIG. 1, a non-linear look-up table stored in ROM is used. In an alternative embodiment, a microprocessor interacting with ROM or other form of memory (i.e. RAM) can be used. The digital gain signal is then converted to an analog gain signal in block 68. The analog gain signal is then used to multiply each component of the multi-component input signal separately in block 70. As noted earlier, gain adjustments are made prior to D/A conversion to minimize or reduce the amount of noise added to the input signals by the D/A converters. The gain adjusted (multiplied) signal is digitized in block 70. Following digitization, the digitized/multiplied signal can go through an optional processing step in block 74 or go directly to the linearizing step of block 76.

The exemplary embodiment of System 10 shown in FIG. 1 and Method 60 shown in FIG. 5 both linearize the digitized/multiplied signal. In an alternate embodiment, it is possible to leave out the linearizing step. This is because the dynamic range change resulting from the gain adjustment affects the contrast of the output signal not the color, in the case of R,G,B video. Therefore, the chromaticity (ratio of the R,G,B signals) remains the same. It is only the contrast (light v. dark or black v. white) which is effected by the dynamic range modification of the present invention.

Figure 6:
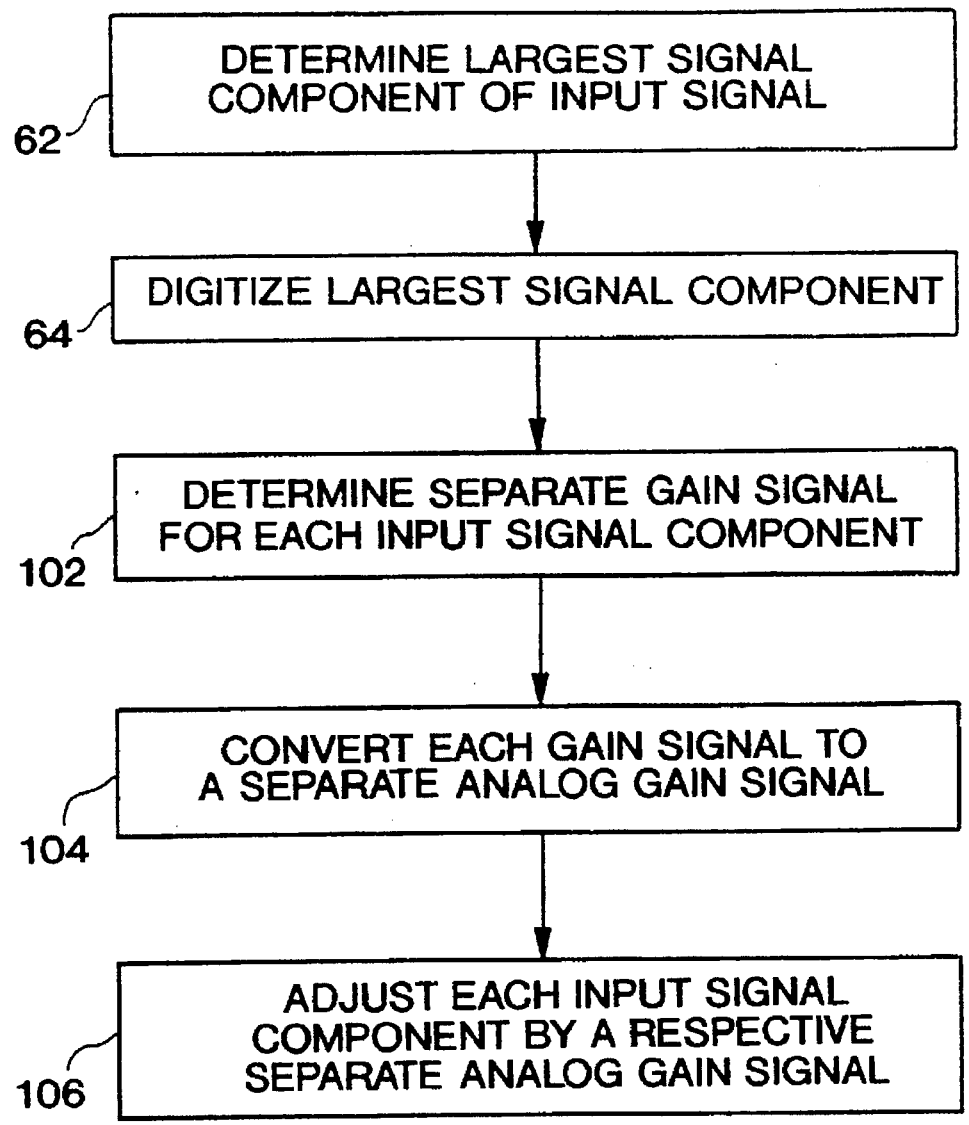
FIG. 6 is a flow chart of a method using exemplary system shown in FIG. 4.

FIG. 6 shows a flow chart of Method 100 using System 54 shown in FIG. 4. Method 100 begins like Method 60 in that the largest signal component of the input signal is determined in block 62 and the largest signal component is digitized in block 64. Following digitization, however, separate gain signals for each input signal component are determined in block 102. For R,G,B video, three separate gain signals are determined, one each, for red, green and blue, respectively. Following the separate gain signal determination block 102, each separate gain signal is converted to an analog signal in block 104. In block 106, each input signal is adjusted by a respective separate analog gain signal.

In Method 100, the difference between the positive and negative reference signals and the input signal component are used to effectuate the gain adjustment of the present invention. It is possible to substitute the reference signal comparison used in Method 100 and systems 52 and 54 with the signal multiplication described in Method 60 and System 10. Similarly, it is possible to change the signal multiplication described in System 6, Method 60 and System 10 with the reference signal comparison described in Method 100 and System 52 and 54. Interchangeability of these gain adjustment systems and methods will be understood by those skilled in the art.

FIGS. 7a, 7b and 7c shown a series of three noise signals. The first shows an input noise signal in relation to a small signal level and a large signal level. The second shows the noise level following A/D conversion without using dynamic noise reduction in accordance with the present invention. It can be seen that the noise level is equal to the small signal level. The third shows the noise level following A/D conversion using dynamic noise reduction in accordance with the present invention. It is clearly shown that the small signal level is not encompassed by the noise level as in the case of A/D conversion without dynamic noise reduction.

Although particular embodiments of the present invention are disclosed herein, it is not intended to limit the invention to such disclosure, and changes and modifications may be incorporated as embodied within the following claims:

What is claimed:

1. A system for reducing noise added to a multi-component analog signal during analog to digital conversion, said multi-component analog signal including a plurality of separate analog signals, each of said separate analog signals having separate amplitude levels, comprising:

a) determining means which determines a reference gain control signal from one of said plurality of separate analog signals of said multi-component analog signal;

b) generating means which generates a gain control signal from said reference gain control signal;

c) adjusting means which increases the separate amplitude levels of each respective one of said separate analog signals of said multi-component analog signal by said gain control signal, to produce a plurality of gain adjusted analog signals; and d) analog to digital conversion means which converts said plurality of gain adjusted analog signals to digital signals.

2. The system of claim 1 wherein said determining means comprises a non-additive mixer having each of said plurality of separate analog signals applied to a respectively different input terminal.

3. The system of claim 1 wherein said reference gain control signal determined by said determining means is proportional to a highest amplitude level of said plurality of separate analog signals.

4. The system of claim 1 wherein said generating means comprises:

i) a first analog to digital converter which converts said reference gain control signal to a digital reference gain control signal;

ii) transforming means which transforms said digital reference gain control signal to a digital gain control signal; and iii) a first digital to analog converter which converts said digital gain control signal to an analog gain control signal.

5. The system of claim 4 wherein said transforming means comprises at least one storage device containing a non-linear look up table.

6. The system of claim 5 wherein said storage device is a Read Only Memory.

7. The system of claim 1 wherein said adjusting means comprises a plurality of multipliers, each of said multipliers having a separate one of said plurality of separate analog signals as a first input signal and said gain control signal as a second input signal.

8. The system of claim 1 wherein said adjusting means comprises a plurality of analog to digital converters, each of said analog to digital converters having a separate one of said plurality of separate analog signals as an input signal and said gain control signal as a reference input voltage.

9. The system of claim 1 further comprising linearizing means which linearizes each of said gain adjusted digital signals.

10. The system of claim 9 wherein said linearizing means comprises a storage device containing a non-linear look up table.

11. The system of claim 10 wherein said storage device is a Read Only Memory.

12. The system of claim 1 wherein the adjusting means adjusts each of said separate analog signals of said multi-component analog signal using a non-linear transformation and the system further comprises linearizing means which restores the relationship between each one of said plurality of separate analog signals of said multi-component analog signal prior to non-linear transformation of each of said plurality of separate analog signals.

13. The system of claim 1 wherein said multi-component signal is an RGB image signal and said separate analog signals are a Red signal, a Green signal and a Blue signal, respectively.

14. The system of claim 1 wherein multi-component signal is a stereo audio signal and said separate analog signals are a right channel signal and a left channel signal, respectively.

15. A system for reducing noise added to a multi-component analog signal during analog to digital conversion, said multi-component analog signal including a plurality of separate analog signals having separate amplitude levels comprising:

a) means which determines an analog reference gain control signal from one of said plurality of separate analog signals of said multi-component analog signal;

b) means which converts said analog reference gain control signal to a digital reference gain control signal;

c) means which determines a digital gain control signal from said digital reference gain control signal;

d) means which converts said digital gain control signal to an analog gain control signal;

e) means which increases the separate amplitude levels of each respective one of said separate analog signals of said multi-component analog signal by said analog gain control signal, producing a plurality of gain adjusted analog signals; and f) means which converts said plurality of gain adjusted analog signals to respective digital signals.

16. The system of claim 15 wherein the adjusting means adjusts each of said separate analog signals of said multi-component analog signal using a non-linear transformation and the system further comprises linearizing means which restores the relationship between each one of said plurality of separate analog signals of said multi-component analog signal prior to non-linear transformation of each of said plurality of separate analog signals.

17. A method for reducing noise added to a multi-component analog signal during analog to digital conversion, said multi-component analog signal including a plurality of separate analog signals, each of said separate analog signals having separate amplitude levels, the method comprising the steps of:
  a) determining a reference gain control signal from one of said plurality of separate analog signals of said multi-component analog signal;
  b) generating a gain control signal from said reference gain control signal;
  c) increasing the separate amplitude levels of each respective one of said separate analog signals of said multi-component analog signal by said gain control signal, to produce a plurality of gain adjusted analog signals; and
  d) converting said plurality of gain adjusted analog signals to digital signals.

18. The method of claim 17 wherein the step of determining a reference gain control signal comprises the steps of:
  i) determining which component of said multi-component signal is largest in magnitude; and
  ii) digitizing said largest magnitude signal.

19. The method of claim 18 comprising the further step of linearizing the digitally converted analog signals.

20. The method of claim 19 wherein the digitally converted analog signal is linearized in correspondence with the non-linear look-up table.

21. The method of claim 17 wherein the step of adjusting each of said separate analog signals of said multi-component analog signal by said gain control signal comprises the step of multiplying said separate analog signals by said gain control signal.

22. A system for reducing noise added to a multi-component analog signal during analog to digital conversion, said multi-component analog signal including a plurality of separate analog signals, each of said separate analog signals having separate amplitude levels, comprising:
  a) determining means which determines a reference gain control signal from said multi-component analog signal;
  b) generating means which generates a gain control signal from said reference gain control signal, said generating means comprising:
    i) a first analog to digital converter which converts said reference gain control signal to a digital reference gain control signal;
    ii) transforming means which transforms said digital reference gain control signal to a digital gain control signal, said transforming means comprises at least one storage device containing a plurality of Read Only Memories, equal in number to said plurality of separate analog signals each containing a non-linear look up table; and
    iii) a first digital to analog converter which converts said digital gain control signal to an analog gain control signal;
  c) adjusting means which increases the separate amplitude levels of each respective one of said separate analog signals of said multi-component analog signal by said gain control signal, to produce a plurality of gain adjusted analog signals; and
  d) analog to digital conversion means which converts said plurality of gain adjusted analog signals to digital signals.

23. The system of claim 22 wherein the adjusting means adjusts each of said separate analog signals of said multi-component analog signal using a non-linear transformation and the system further comprises linearizing means which restores the relationship between each one of said plurality of separate analog signals of said multi-component analog signal prior to non-linear transformation of each of said plurality of separate analog signals.

24. A method for reducing noise added to a multi-component analog signal during analog to digital conversion, said multi-component analog signal including a plurality of separate analog signals, each of said separate analog signals having a separate amplitude level, the method comprising the steps of:
  a) determining a reference gain control signal from said multi-component analog signal;
  b) generating a gain control signal from said reference gain control signal by passing said reference gain control signal through a non-linear look-up table containing predetermined gain control signal values;
  c) increasing the separate amplitude levels of each respective one of said separate analog signals of said multi-component analog signal by said gain control signal, to produce a plurality of gain adjusted analog signals; and
  d) converting said plurality of gain adjusted analog signals to digital signals.

25. The method of claim 24 wherein step c) includes the step of adjusting each of said separate analog signals of said multi-component analog signal using a non-linear transformation and the method further comprises the step of restoring the relationship between each one of said plurality of separate analog signals of said multi-component analog signal prior to non-linear transformation of each of said plurality of separate analog signals.

26. A method for reducing noise added to a multi-component analog signal during analog to digital conversion, said multi-component analog signal including a plurality of separate analog signals, each of said separate analog signals having separate amplitude levels, the method comprising the steps of:
  a) determining a reference gain control signal from said multi-component analog signal;
  b) generating a gain control signal from said reference gain control signal by passing said reference gain control signal through a plurality of separate non-linear look-up tables, each non-linear look-up table corresponding to one component of said multi-component analog signal, and each non-linear look-up table containing predetermined gain control signal values;
  c) increasing the separate amplitude levels of each respective one of said separate analog signals of said multi-component analog signal by said gain control signal, to produce a plurality of gain adjusted analog signals; and
  d) converting said plurality of gain adjusted analog signals to digital signals.

27. The method of claim 26 wherein step c) includes the step of adjusting each of said separate analog signals of said multi-component analog signal using a non-linear transformation and the method further comprises the step of restoring the relationship between each one of said plurality of separate analog signals of said multi-component analog signal prior to non-linear transformation of each of said plurality of separate analog signals.

28. The method of claim 17 wherein step c) adjusts each of said separate analog signals of said multi-component analog signal using a non-linear transformation and the method further comprises the step of restoring the relationship between each one of said plurality of separate analog signals of said multi-component analog signal prior to non-linear transformation of each of said plurality of separate analog signals.

* * * * *